United States Patent
Yang et al.

(10) Patent No.: US 6,444,027 B1
(45) Date of Patent: Sep. 3, 2002

(54) MODIFIED SUSCEPTOR FOR USE IN CHEMICAL VAPOR DEPOSITION PROCESS

(75) Inventors: Charles Chiun-Chieh Yang, St. Peters; Robert W. Standley, Chesterfield, both of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/566,890

(22) Filed: May 8, 2000

(51) Int. Cl.⁷ .............................................. C30B 25/12
(52) U.S. Cl. .................... 117/200; 117/900; 117/88; 117/89; 118/715; 118/725
(58) Field of Search ................. 117/200, 900, 117/88, 89; 118/725, 715

(56) References Cited

U.S. PATENT DOCUMENTS

| | | | |
|---|---|---|---|
| 4,322,592 A | 3/1982 | Martin | 219/10.49 R |
| 4,496,609 A | 1/1985 | McNeilly et al. | 427/55 |
| 5,192,371 A | 3/1993 | Shuto et al. | 118/728 |
| 5,200,157 A | 4/1993 | Toya et al. | 422/246 |
| 5,242,501 A | 9/1993 | McDiarmid | 118/728 |
| 5,516,367 A * | 5/1996 | Lei et al. | 118/725 |
| 5,679,405 A | 10/1997 | Thomas et al. | |
| 5,769,942 A | 6/1998 | Maeda | 117/89 |
| 5,856,240 A * | 1/1999 | Sinha et al. | 438/758 |
| 5,904,769 A | 5/1999 | Ohashi et al. | 117/89 |
| 5,960,555 A | 10/1999 | Deaton et al. | 34/58 |
| 6,103,014 A * | 8/2000 | Lei et al. | 118/715 |
| 6,127,286 A * | 10/2000 | Zhang et al. | 438/790 |
| 6,129,047 A | 10/2000 | Nakamura | |
| 6,184,154 B1 | 2/2001 | Dietze et al. | |

FOREIGN PATENT DOCUMENTS

| | | |
|---|---|---|
| GB | 2 181 460 A | 4/1987 |
| JP | Sho-58-130518 | 8/1983 |
| JP | 08008198 A | 1/1996 |
| JP | 10144697 | 5/1998 |
| JP | 10223545 A | 8/1998 |
| JP | 1116844 A | 1/1999 |
| JP | 11087250 | 3/1999 |
| WO | WO 90/13687 | 11/1990 |
| WO | 0 730 048 A1 | 9/1996 |
| WO | 0 784 106 A1 | 7/1997 |
| WO | 0 792 954 A2 | 9/1997 |
| WO | 0 825 279 A1 | 2/1998 |
| WO | 0 953 659 A2 | 11/1999 |
| WO | WO 00/22198 | 4/2000 |
| WO | WO 00/34999 | 6/2000 |
| WO | 1 043 764 A1 | 10/2000 |

OTHER PUBLICATIONS

International Search Report, PCT/US o1/13046 dated Oct. 23, 2001.
International Search Report, PCT/US 01/12668 dated Nov. 15, 2001.

* cited by examiner

*Primary Examiner*—Robert Kunemund
(74) *Attorney, Agent, or Firm*—Senniger, Powers, Leavitt & Roedel

(57) ABSTRACT

A modified susceptor for use in an epitaxial deposition apparatus and process is disclosed. The modified susceptor has an inner annular ledge capable of supporting a semiconductor wafer and has a plurality of holes in the surface to allow cleaning gas utilized during an epitaxial deposition process to pass through the susceptor and contact substantially the entire back surface of the semiconductor wafer and remove a native oxide layer. Also, the plurality of holes on the susceptor allows dopant atoms out-diffused from the back surface during the epitaxial deposition process to be carried away from the front surface in an inert gas stream and into the exhaust such that autodoping of the front surface is minimized.

42 Claims, 5 Drawing Sheets

MODIFIED SUSCEPTOR FOR USE IN CHEMICAL VAPOR DEPOSITION PROCESS

BACKGROUND OF THE INVENTION

The present invention relates to a modified susceptor for use in a chemical vapor deposition process. More particularly, the present invention relates to a modified susceptor having a plurality of holes for use in an epitaxial deposition reactor and process such that autodoping of the front surface of a semiconductor wafer and discontinuous silicon growth on the back surface of the semiconductor wafer is significantly reduced or eliminated.

In the production of single silicon crystals grown by the Czochralski method, polycrystalline silicon is first melted within a quartz crucible with or without dopant. After the polycrystalline silicon has melted and the temperature equilibrated, a seed crystal is dipped into the melt and subsequently extracted to form a single crystal silicon ingot while the quartz crucible is rotated. The single crystal silicon ingot is subsequently sliced into individual semiconductor wafers which are subjected to several processing steps including lapping/grinding, etching, and polishing to produce a finished semiconductor wafer having a front surface with specular gloss. To prepare the finished wafer for device manufacturing, the wafer may be subjected to a chemical vapor deposition process such as an epitaxial deposition process to grow a thin layer of silicon generally between about 0.1 and about 200 micrometers thick on the front surface of the wafer such that devices can be fabricated directly on the epitaxial layer. Conventional epitaxial deposition processes are disclosed in U.S. Pat. Nos. 5,904,769 and 5,769,942.

The epitaxial deposition process is typically comprised of two steps. In the first step after the semiconductor wafer is loaded into a deposition chamber and lowered onto a susceptor, the front surface of the wafer is subjected to a cleaning gas such as hydrogen or a hydrogen/hydrochloric acid mixture at about 1150° C. to "pre-bake" and clean the front surface of the semiconductor wafer and remove any native oxide on that surface to allow the epitaxial silicon layer to grow continuously and evenly onto the front surface. In the second step of the epitaxial deposition process the front surface of the wafer is subjected to a vaporous silicon source such as silane or trichlorosilane at about 800° C. or higher to deposit and grow an epitaxial layer of silicon on the front surface. During both steps of the epitaxial deposition process the semiconductor wafer is supported in the epitaxial deposition chamber by the susceptor which is generally rotated during the process to ensure even growth of the epitaxial layer. The susceptor is generally comprised of high purity graphite and has a silicon carbide layer completely covering the graphite to reduce the amount of contaminants such as iron released from the graphite into the surrounding ambient during high temperature processes. Conventional susceptors used in epitaxial growth processes are well known in the art and described in U.S. Pat. Nos. 4,322,592, 4,496,609, 5,200,157, and 5,242,501.

When a conventional susceptor is utilized in the epitaxial deposition process, during the loading process as the wafer is lowered onto the susceptor, gas can be trapped between the susceptor and the wafer causing the wafer to "float" and slide onto the susceptor in a tilted position. This can result in uneven epitaxial growth. Furthermore, during the pre-bake step a small amount of cleaning gas such as hydrogen can effuse around the wafer edge between the wafer and the susceptor and into the space between the wafer and the susceptor. If the back surface of the wafer is sealed with an oxide layer, such as a low temperature oxide layer, the effused hydrogen will not react sufficiently with the oxide layer to create pinholes in the layer or completely remove the oxide layer. If the back surface is an etched or polished surface as desired by many device manufacturers and only contains a thin native oxide layer, the hydrogen or hydrogen/hydrochloric acid mixture will completely remove the native oxide layer near the outer edge of the back surface where the cleaning gas effuses around the wafer and will create pinhole openings in the native oxide layer exposing the silicon surface as etching moves away from the outer edge of the wafer. These pinhole openings typically form a ring or "halo" around the wafer.

During the epitaxial deposition process a small amount of silicon containing source gas can also effuse around the wafer edge between the wafer and the susceptor and into space between the wafer and the susceptor. If the back surface of the wafer is oxide sealed, nucleation and growth of a silicon film is substantially suppressed. In areas where the native oxide layer has been completely etched away by the cleaning gas a smooth continuous layer of silicon is grown. Where the cleaning gas has not completely removed the native oxide layer and pinholes have created exposed silicon, however, the silicon containing source gas can deposit silicon in the pinholes and create a non-uniform silicon film on the wafer backside during the epitaxial deposition. Thus, for wafers with etched or polished back surfaces having only a native oxide layer, pinholes created in the native oxide layer during the pre-bake step may lead to discontinuous silicon growth on the back surface which appears hazy under bright light illumination. This haziness or "halo" on the back surface of the wafer is comprised of small silicon growths or bumps having a diameter of about 0.5 micrometers and being about 10 nanometers high. These bumps of silicon scatter light and lead to the haziness and are undesirable as they can interfere with machine vision and optical pyrometry systems that view the back surface of the wafer during device processing.

Another problem encountered during the high temperature growth of the epitaxial silicon layer is the out-diffusion of dopant atoms such as boron or phosphorus through the back surface of the semiconductor wafer during the high temperature pre-bake and the epitaxial growth steps. With conventional susceptors, the dopant atoms that out-diffuse from the back surface are trapped between the susceptor and the wafer itself and can effuse between the wafer edge and the susceptor toward the front surface of the wafer. These dopant atoms can be incorporated into and contaminate the growing deposition layer and degrade the resistivity uniformity near the wafer edge. If the back surface of the semiconductor wafer is oxide sealed using for example, a low temperature oxide, the dopant atoms will not substantially out-diffuse from the back surface. Semiconductor wafers having etched or polished back surfaces, however, are subject to out-diffusion of dopant atoms from the back surface during the epitaxial deposition process which can lead to unwanted autodoping of the front surface.

Several methods have been suggested for attempting to eliminate back surface halos and autodoping. To eliminate back surface halos Nakamura (Japanese Unexamined Patent Application No. JP11-16844) disclosed performing a hydrogen fluoride strip and/or a high-temperature hydrogen annealing step of the back surface up to 10 days before the wafers are loaded into the epitaxial reactor. The process adds additional processing steps which can greatly increase complexity and cost of the deposition process. Deaton et al. (U.S.

Pat. No. 5,960,555) disclosed a method of preventing the frontside reactive source gas from effusing to the wafer backside by utilizing a susceptor with built-in channels along the wafer edge for directing purge gas flows to the edge of the wafer. This process requires substantial modification of existing epitaxial deposition chambers and utilizes increased purge gas flows which can cause the purge gas to spill over to the front surface and mix with the source gas which can degrade the resulting epitaxial film.

To reduce autodoping, Hoshi (Japanese Unexamined Patent Application No. JP11-87250) disclosed using vacuum sucking on the edge of a susceptor to evacuate boron dopant on the edge of the susceptor and prevent autodoping. This process may affect wafer edge uniformity and thickness and requires substantial modification to existing epitaxial deposition systems. Nakamura (Japanese Unexamined Patent Application JP10-223545) disclosed a modified susceptor having slots on the edge of the susceptor such that the out-diffused dopant atoms would be pushed down through the slots and into the exhaust. This method also allows a substantial amount of the deposition gas to be evacuated below the back surface of the wafer which can lead to the halo affect previously discussed as well as premature corrosion of the exhaust system and safety concerns.

To date, the prior art fails to disclose satisfactory methods of controlling the halo effect on the back surface of semiconductors and autodoping problems associated with dopant out-diffusion from the back surface during an epitaxial deposition process. As such, a need exists in the semiconductor industry for a simple, cost effective approach to solving the halo effect and unwanted autodoping of the front surface of a semiconductor wafer during an epitaxial deposition process.

SUMMARY OF THE INVENTION

Among the objects of the present invention, therefore, are the provision of a modified susceptor which allows cleaning gas to contact substantially the entire back surface of a semiconductor wafer; the provision of a modified susceptor which significantly reduces autodoping of the front surface of a semiconductor wafer during epitaxial silicon growth; the provision of a modified susceptor which allows substantially complete native oxide removal from the back surface of a semiconductor wafer during the pre-bake step of epitaxial deposition and substantially eliminates the halo affect; the provision of a modified susceptor having a plurality of holes such that epitaxial wafers produced using the susceptor are of improved quality; and the provision of a modified susceptor which reduces or eliminates wafer "floating" during loading.

Briefly, therefore, the present invention is directed to an apparatus for use in a chemical vapor deposition process wherein an epitaxial layer is grown on a semiconductor wafer. The apparatus comprises a susceptor sized and configured for supporting the semiconductor wafer. The susceptor has a surface having a density of openings between about 0.2 openings/cm$^2$ and about 4 openings/cm$^2$ which is in generally parallel opposed relationship with the wafer to permit fluid flow therethrough.

The invention is further directed to an apparatus for use in an epitaxial deposition process wherein an epitaxial layer is grown on a semiconductor wafer. The apparatus comprises a susceptor sized and configured for supporting the semiconductor wafer. The susceptor has a surface having a density of openings between about 0.5 openings/cm$^2$ and about 2 openings/cm$^2$ which is in generally parallel opposed relationship with the wafer to permit fluid flow therethrough. The apparatus further comprises a rotatable means for supporting the susceptor and the wafer, a heating element, an edge ring surrounding the periphery of the susceptor, and a gas inlet and a gas outlet.

The invention is further directed to a process for growing an epitaxial silicon layer on a semiconductor wafer. The process comprises introducing a cleaning gas into an epitaxial deposition chamber containing a wafer such that the gas flows parallel to the front and back surfaces and contacts the front surface of the wafer and substantially the back surface to remove a native oxide layer from the surfaces. After the cleaning gas, a silicon containing source gas is introduced into the deposition chamber to grow an epitaxial silicon layer on the front surface Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that high quality semiconductor wafers having an epitaxial silicon layer on the front surface can be produced utilizing an epitaxial deposition chamber incorporating a modified susceptor having a plurality of openings. Advantageously, the modified susceptor substantially eliminates "floating" during loading and allows fluid transport toward and away from the back surface of the wafer which allows the cleaning gas utilized in the pre-bake step of an epitaxial deposition process to contact substantially the entire back surface of the semiconductor wafer and chemically remove substantially the entire native oxide layer such that during the growth of the epitaxial layer when source gas contacts the back surface of the semiconductor wafer a smooth continuous layer of silicon is grown and the halo affect on the back surface is significantly reduced or eliminated. Furthermore, the modified susceptor allows dopant atoms contained in the semiconductor wafer that out-diffuse from the back surface of the wafer during the epitaxial deposition process to be carried away from the front surface of the wafer in a purge gas stream and into the exhaust to keep a substantial amount of dopant from effusing between the wafer and the susceptor edge and contact the front surface resulting in unwanted autodoping of the front surface.

Figure 1:
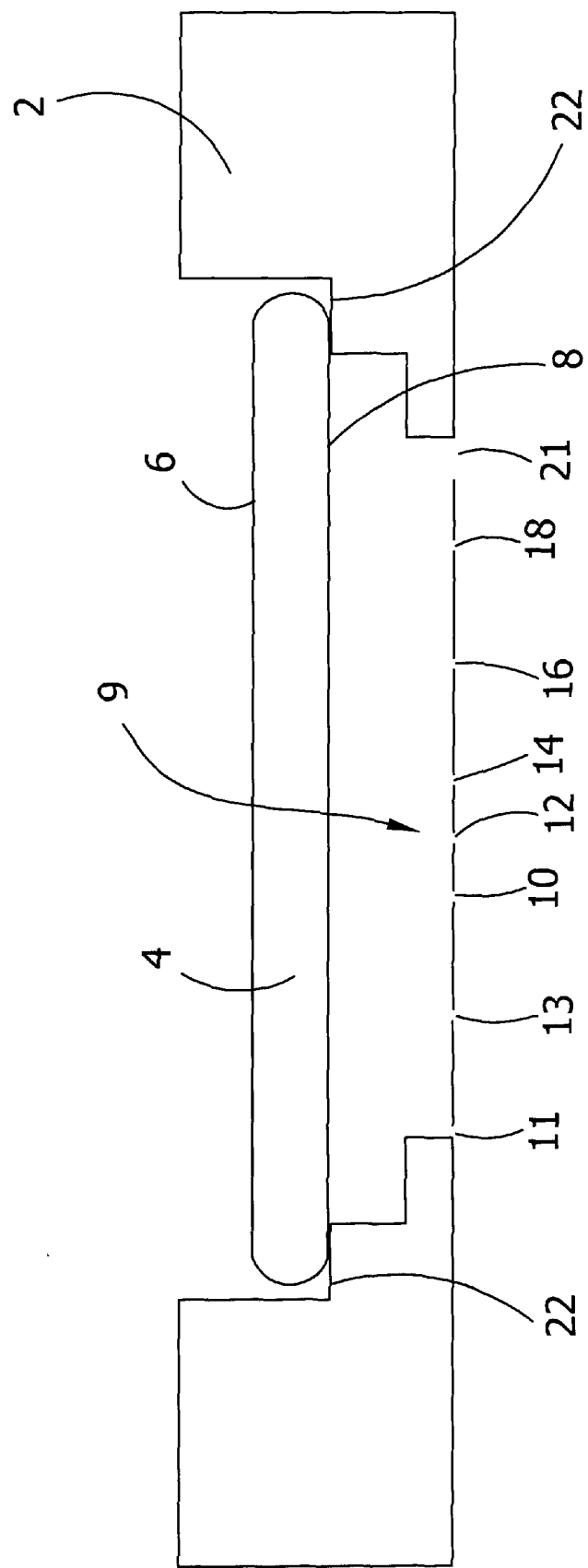
FIG. 1 is a cross section of the modified susceptor of the present invention taken in the plane of line 1—1 of FIG. 2.

Referring now to the Figures, and more particularly to FIG. 1, there is shown a cross sectional view of the modified susceptor 2 of the present invention. Modified susceptor 2 has an inner annular ledge 22 which is capable of supporting semiconductor wafer 4 which has a front surface 6 and a back surface 8. Modified susceptor 2 has a porous surface 9 with a plurality of holes or openings 10, 11, 12, 13, 14, 16, and 18 and wafer lift pinhole 21. The terms openings and holes maybe used interchangeably herein and both refer to the open passageways in the porous surface 9. Porous surface 9 having the openings is located directly below the semiconductor wafer 4. As used herein, the term "plurality" means two or more holes. Holes 10, 11, 12, 13, 14, 16, and 18 are drilled into modified susceptor 2 prior to the coating being applied. During the pre-bake step of an epitaxial deposition process, holes 10, 11, 12, 13, 14, 16, and 18 allow the cleaning gas to contact substantially the entire back surface 8 of semiconductor wafer 4 to allow the cleaning gas to react with, and remove substantially all native oxide on the back surface 8 of semiconductor wafer 4. The portion of back surface 8 of semiconductor wafer 4 in contact with the inner annular ledge 22 of susceptor 2 is also substantially etched by the cleaning gas as the gas will effuse between the wafer and the susceptor resulting in substantially complete removal of the native oxide layer on the back surface. The removal of the native oxide from the back surface 8 significantly reduces or eliminates any halo effect on the back surface of the semiconductor wafer as any source gas that effuses between the wafer and the susceptor during the epitaxial growth process and contacts back surface 8 will grow smoothly and continuously on top of the silicon surface. Holes 10, 11, 12, 13, 14, 16, and 18 also allow dopant atoms that out-diffuse from the back surface 8 of semiconductor wafer 4 during the high temperature cleaning step and epitaxial deposition step of an epitaxial deposition process to drain through the holes into a purge gas or hydrogen stream and away from the front surface 6 of semiconductor wafer 4 into the exhaust system. As such, a significant reduction in autodoping of the front surface during an epitaxial deposition process is realized.

Figure 2:
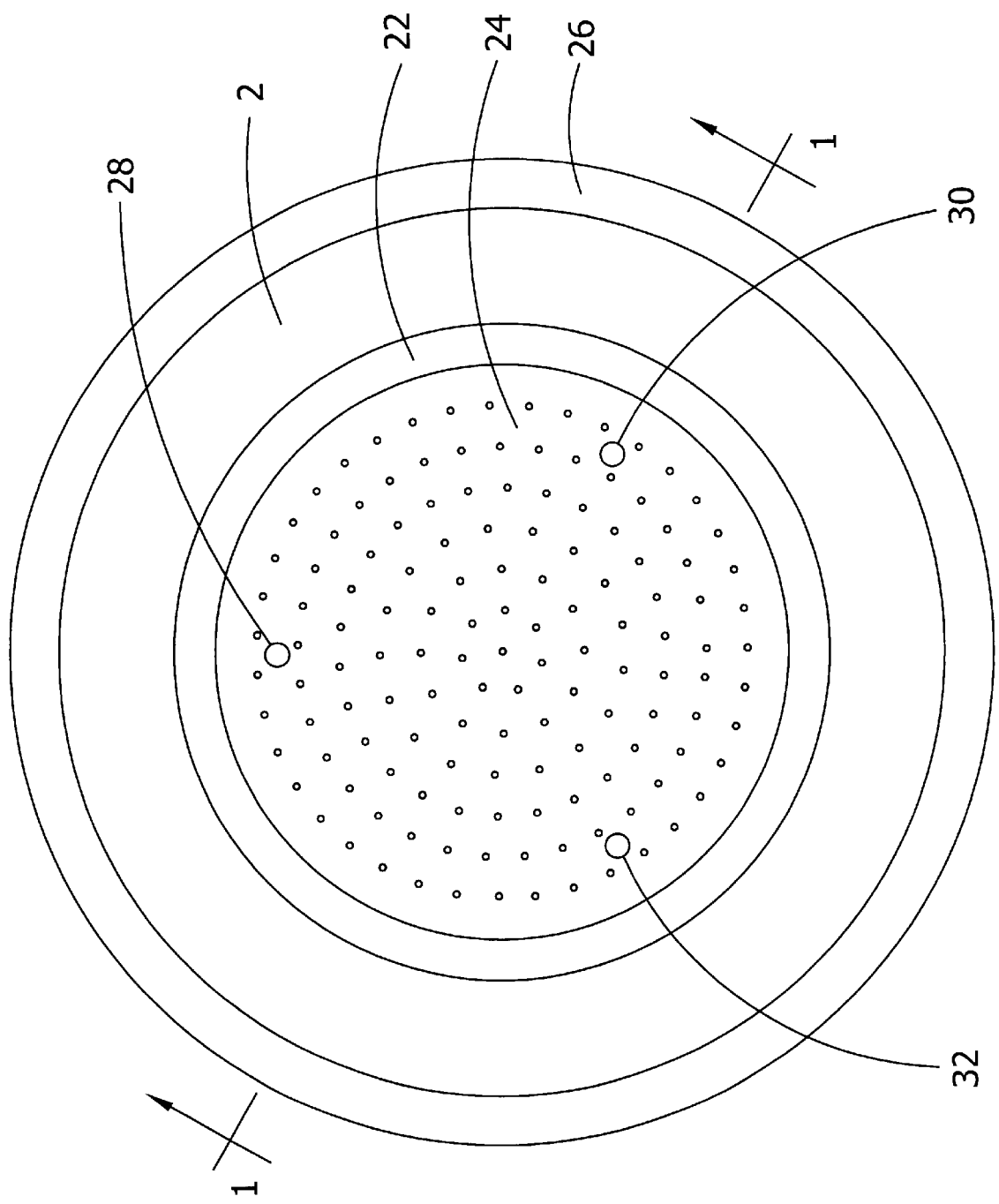
FIG. 2 is a top view of the modified susceptor of the present invention.

Referring now to FIG. 2, there is shown a top view of modified susceptor 2 having inner annular ledge 22 and porous surface 24 having a plurality of holes. Wafer lift pin holes 28, 30, and 32 on porous surface 24 allow lift pins (not shown) below the modified susceptor 2 to raise and lower semiconductor wafers onto and off of the modified susceptor during and after an epitaxial deposition process. Edge ring 26 surrounds the periphery of modified susceptor 2 and is utilized throughout an epitaxial deposition process to ensure temperature uniformity across a semiconductor wafer such that a temperature gradient does not form across the wafer and adversely affect the deposition process. Edge ring 26 generally has a diameter 4 centimeters to about 10 centimeters greater than the diameter of modified susceptor 2 and is comprised of high purity graphite which has a silicon carbide or glassy carbon coating.

The modified susceptor of the present invention can be sized and configured such that the inner annular ledge of the susceptor can accommodate any diameter semiconductor wafer including, for example, 150 millimeter, 200 millimeter and 300 millimeter wafers. The modified susceptor may be constructed of conventional materials such as high purity graphite and has a silicon carbide or glassy carbon layer covering the graphite to reduce the amount of contaminants released into the surrounding ambient from the graphite during the high temperature epitaxial deposition process. The graphite utilized to construct the susceptor is generally at least about 99%, more preferably at least about 99.9% and most preferably at least about 99.99% pure graphite. Also, the graphite preferably contains less than about 20 ppm total metals such as iron, molybdenum, copper, and nickel, and more preferably less that about 5 ppm total metals such as iron, molybdenum, copper, and nickel. The silicon carbide or glassy carbon coating covering the graphite generally has a thickness of between about 75 micrometers and about 150 micrometers, preferably about 125 micrometers.

The holes in the porous surface of the modified susceptor located directly below the semiconductor wafer preferably have a diameter such that the silicon carbide or glassy carbon coating, if applied to the susceptor after the holes have been drilled into the susceptor, will not substantially block or plug the holes and thus restrict fluid flow therethrough. It will be recognized by one skilled in the art that the openings, generally referred to as holes throughout, could be squares, slots, diamond shapes, or any other shapes allowing fluid flow therethrough. The openings preferably have a width of between about 0.1 millimeters and about 3 millimeters, more preferably between about 0.1 millimeters and about 1 millimeter, and most preferably between about 0.5 millimeters and about 1 millimeter. The width of the openings is defined as the greatest distance between two corners of the opening or the diameter if the opening is a circle. The holes are spaced on the modified susceptor to allow the cleaning gas utilized during the pre-bake step of the epitaxial deposition process to contact and etch substantially the entire back surface of the semiconductor wafer. Spacing of the holes of the modified susceptor of between about 0.5 millimeters and about 4 centimeters apart, more preferably between about 2 millimeters and about 2 centimeters apart, and most preferably between about 6 millimeters and about 1.5 centimeters apart allows the cleaning gas to contact substantially the entire back surface of the semiconductor wafer such that it may etch substantially all of the native oxide from the back surface. The total percentage of open area on the surface of the susceptor is between about 0.5% and about 4% of the total surface area of the susceptor, more preferably between about 1% and about 3% of the total surface area of the susceptor. The surface of the susceptor preferably has a density of between about 0.2 holes/cm$^2$ and about 4 holes/cm$^2$, more preferably between about 0.8 holes/cm$^2$ and about 1.75 holes/cm$^2$. Density as used herein means either a uniform or non-uniform density.

It is generally preferred that the holes in the modified susceptor have as small a diameter as practical yet not allow the silicon carbide or glassy carbon coating to restrict fluid flow through the holes to the back surface of the semiconductor wafer. If the holes in the susceptor are drilled too large, nanotopology problems on the front surface of the wafer that are caused by localized temperature non-uniformity on the back surface can occur. Large diameter holes in the modified susceptor can lead to the development of hot spots or cold spots on the back surface of the semiconductor wafer through direct irradiation of the back surface by the heating lamps located below the semiconductor wafer. These hot or cold spots cause temperature gradients to form across the front surface of the semiconductor wafer and can lead to non-uniform epitaxial silicon growth on the front surface of the semiconductor wafer. Non-uniform growth of the epitaxial layer significantly degrades the wafer quality. The holes on the modified susceptor can be drilled into the susceptor at an oblique angle to further reduce the possibility of direct irradiation of the back surface by the heating lamps and the formation of hot or cold spots leading to non-uniform epitaxial growth on the front surface yet still allow gases to penetrate the susceptor and contact the back surface and allow out-diffused dopant atoms to move away from the back surface. To further decrease the potential for the formation of hot or cold spots and the creation of temperature gradients on the semiconductor wafer by direct illumination of the wafer through the holes and reduce or eliminate any hot or cold spots caused by the lift pin holes, the lamp power ratio of the heating lamps above and below the semiconductor wafer can be adjusted and tuned to produce a balanced heating from the lamps.

Figure 3:
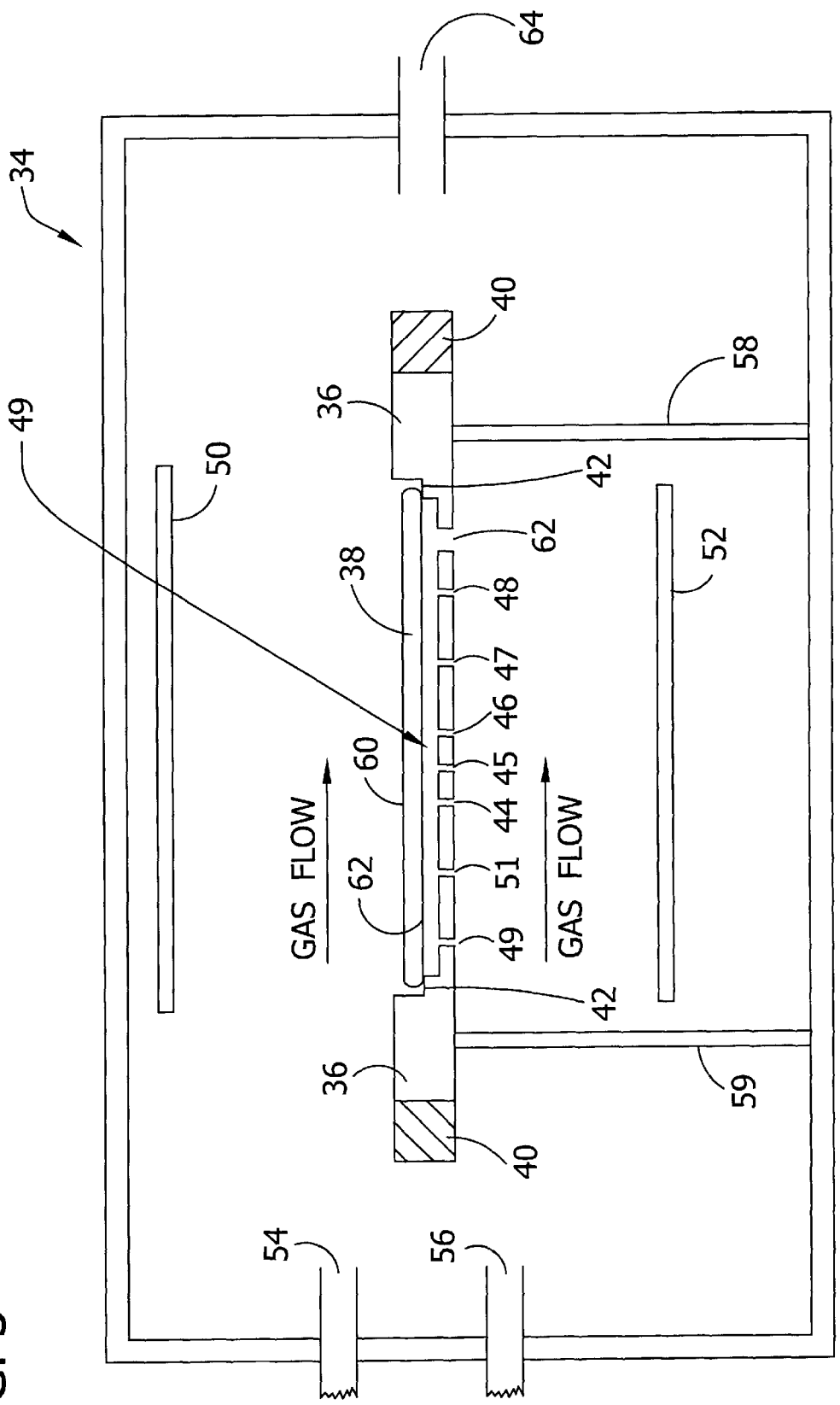
FIG. 3 is an epitaxial reaction chamber showing the modified susceptor of the present invention in cross section taken in the plane of line 1—1 of FIG. 2.

The modified susceptor of the present invention may be utilized as part of an apparatus for chemical vapor deposition processes such as an epitaxial deposition processes. Referring now to FIG. 3, there is shown an epitaxial reaction chamber 34 for use during an epitaxial growth process utilizing the modified susceptor 36 of the present invention. Modified susceptor 36 is attached to rotatable support means 58 and 59 and is sized and configured to support semiconductor wafer 38 on inner annular ledge 42 during an epitaxial deposition process. Semiconductor wafer 38 is in spaced relationship with holes 44, 45, 46, 47, 48, 49, and 51 in porous surface 49 in modified susceptor 36. Lift pin hole 62 allows a lift pin (not shown) access through porous surface 9 of modified susceptor 36 to semiconductor wafer 38 such that semiconductor wafer 38 may be lifted onto and off of modified susceptor 36 before and after an epitaxial deposition process. Epitaxial deposition chamber 34 also contains heating lamp arrays 50 and 52 located above and below modified susceptor 36 respectively for heating during an epitaxial deposition process. Gas inlets 54 and 56 allow the introduction of the cleaning gas during the prebake step of the epitaxial deposition process such that cleaning gas is introduced above and below the semiconductor wafer 38 to enhance the native oxide removal of the front surface 60 and back surface 62 of semiconductor wafer 38. During the epitaxial growth step, gas inlet 54 introduces a silicon containing source gas which is flowed above the wafer 38 and gas inlet 56 introduces hydrogen or an inert gas below the wafer 38 to flush the back surface 62 of the semiconductor wafer 38 and carry out-diffused dopant atoms away from the front surface. As indicated in FIG. 3, the gas injected into the epitaxial deposition chamber flows parallel to the front and back surfaces of the semiconductor wafer. Such a flow pattern allows the injected gases to contact the front surface and penetrate the susceptor through the holes in the susceptor's surface to contact the back surface of the wafer. Because the gases flow parallel to the semiconductor surfaces and not perpendicular, the possibility of the semiconductor wafer being lifted off of the annular ledge by gasses effusing between the wafer edge and edge of the annular ledge and becoming deformed is significantly reduced or eliminated. Gases introduced into chamber 34 from gas inlets 54 and 56 are removed from chamber 34 through exhaust port 64.

The holes in the modified susceptor will allow the cleaning gas to pass through the modified susceptor and contact substantially the entire back surface of the semiconductor wafer during the cleaning step such that any native oxide present on the back surface will be removed by the cleaning gas. This native oxide removal from the back surface will allow a smooth, continuous epitaxial silicon layer to grow on any portion of the back surface of the semiconductor wafer that is contacted with the source gas during the growth of the epitaxial layer and thus will substantially eliminate the formation of any halo on the back surface. Furthermore, the holes in the modified susceptor will allow inert gas or hydrogen to contact the back surface of the wafer such that dopant atoms that out-diffuse from the back surface during both the cleaning step and the epitaxial growth step may be carried away from the semiconductor wafer and into the exhaust thus substantially decreasing the possibility of autodoping the front surface of the wafer.

The epitaxial reaction chamber containing the modified susceptor of the present invention described above may be utilized for both the cleaning and the growth steps of an epitaxial deposition process. In one epitaxial deposition process in accordance with the present invention, an epitaxial silicon layer is grown on the front surface of a semiconductor wafer. In a preferred embodiment of the present invention, a silicon wafer is introduced into an epitaxial deposition chamber at ambient pressure and a cleaning gas such as hydrogen or a mixture of hydrogen and hydrochloric acid is introduced into the chamber at a temperature of between about 1000° C. and about 1300° C. at a flow rate of between about 1 liter/minute and about 50 liters/minute, preferably between about 10 liters/minute and about 20 liters/minute for at least about 10 seconds to remove the native oxide layers on the front and back surfaces of the semiconductor wafer.

Once the native oxide layers have been removed from both the front and back surfaces of the semiconductor wafer, the cleaning gas is discontinued and the temperature in the reaction chamber is adjusted to between about 600° C. and about 1200° C. and a silicon containing source gas such as silane or dichlorosilane, for example, is introduced above the front surface of the semiconductor wafer at a flow rate of between about 1 liter/minute and about 20 liters/minute for a period of time sufficient to grow an epitaxial silicon layer on the front surface of the semiconductor wafer having a thickness of between about 0.1 and about 200 micrometers, preferably between about 1 and about 100 micrometers. At the same time the silicon containing source gas is introduced into the deposition chamber above the front surface of the semiconductor wafer, a gas such as nitrogen, argon, hydrogen, a mixture thereof or the source gas is introduced below the back surface of the semiconductor wafer at a flow rate of between about 1 liter/minute and about 50 liters/minute, preferably between about 10 liters/minute and about 20 liters/minute such that the purge gas can contact the back surface of the semiconductor wafer and carry out-diffused dopant atoms from the back surface toward to the exhaust outlet. This preferred embodiment significantly reduces or eliminates any back surface halo effect and minimizes autodoping of the front surface. Although the preferred epitaxial deposition process is carried out at ambient pressure, reduced pressure chemical vapor deposition is also within the scope of the present invention.

Figure 4:
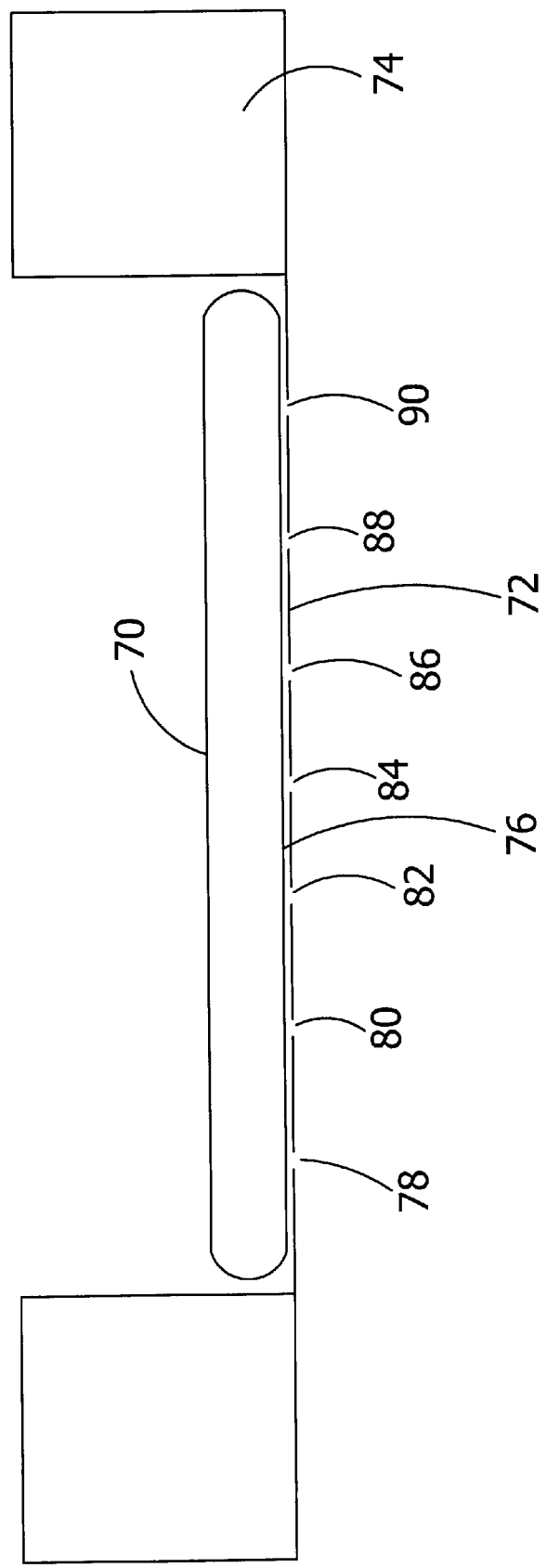
FIG. 4 is a cross section of a modified susceptor of the present invention.

In an alternative embodiment of the present invention, the modified susceptor may be sized and configured to allow the semiconductor wafer to rest directly on the porous surface thus eliminating the inner annular ledge 22 as shown in FIG. 1. Referring now to FIG. 4, there is shown a cross section of a modified susceptor where the semiconductor wafer rests directly upon the porous surface. The back surface 76 of semiconductor wafer 70 sits directly on porous surface 72 of modified susceptor 74. Although back surface 76 of wafer 70 is in direct contact with the porous surface 72, gases flowed beneath modified susceptor 74 are able to penetrate porous surface 72 through holes 78, 80, 82, 84, 86, 88, and 90 and contact substantially the entire back surface 76 of wafer 70.

Figure 5:
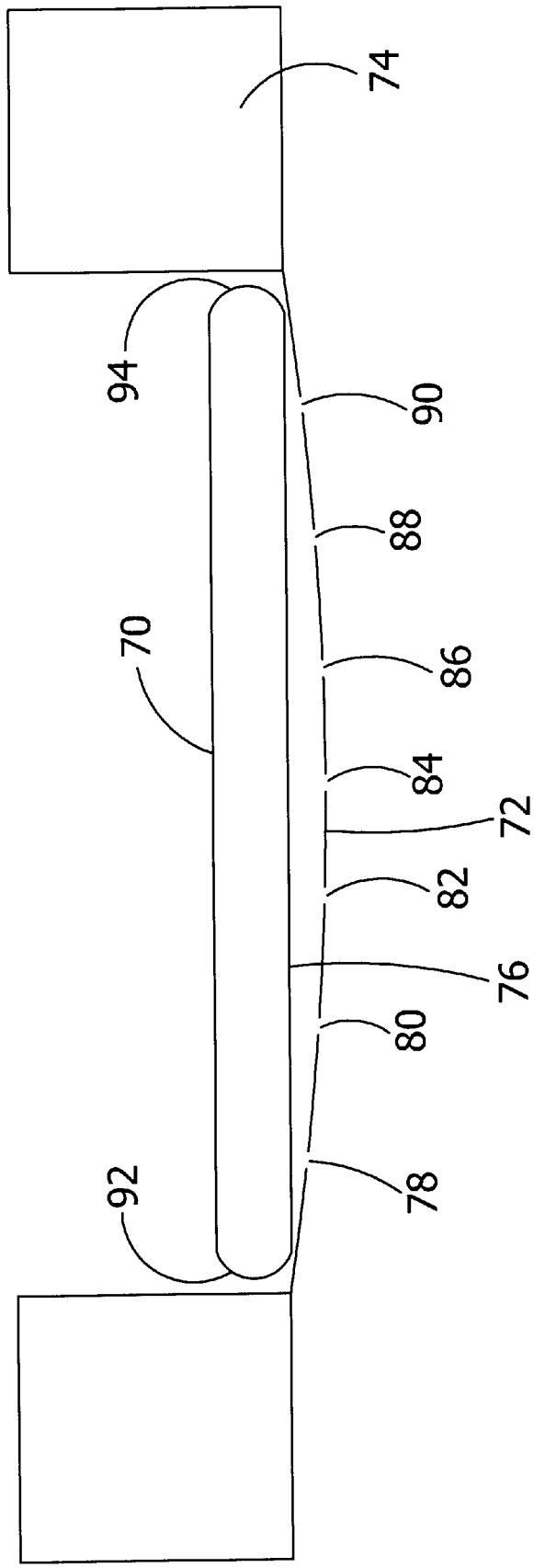
FIG. 5 is a cross section of a modified susceptor of the present invention.

In a further alternative embodiment, the modified susceptor of the present invention as illustrated in FIG. 4 may be further modified such that porous surface 72 is shaped in a dish or dome shape to allow only the outer edges of the semiconductor wafer to contact the modified susceptor. Referring now to FIG. 5, there is shown a cross section of a modified susceptor where the semiconductor wafer rests directly on the porous surface of the susceptor. The back surface 76 of semiconductor wafer 70 sits directly on porous surface 72 of modified susceptor 74. Porous surface 72 is shaped like a dish or dome such that the outer edges 92 and 94 of semiconductor wafer 70 are in direct contact with the porous surface 72 and the remainder of back surface 76 or wafer 70 is not in direct contact with porous surface 72. During use, holes 78, 80, 82, 84, 86, 88, and 90 allow fluid flow therethrough to the back surface of the wafer.

It will be recognized by one skilled in the art that the modified susceptor of the present invention can be utilized with various types of deposition reactors including barrel, pancake and mini batch reactors regardless of the shape of the susceptor utilized.

In view of the above, it will be seen that the several objects of the invention are achieved. As various changes could be made in the above-described modified susceptor without departing from the scope of the invention, it is intended that all matter contained in the above description be interpreted as illustrative and not in a limiting sense.

What is claimed is:

1. A susceptor for supporting a semiconductor wafer during a chemical vapor deposition process wherein an epitaxial silicon layer is grown on the semiconductor wafer, the semiconductor wafer having a front surface and a back surface, the susceptor comprising:
   a porous surface in generally parallel, opposed relationship with the back surface of the semiconductor wafer supported by the susceptor to permit gas flow through the susceptor for contact with the back surface of said semiconductor wafer, the porous surface having a density of openings between about 0.2 openings/cm$^2$ and about 4 openings/cm$^2$; and
   an edge ring surrounding the periphery of the susceptor.

2. A susceptor as set forth in claim 1 wherein the susceptor is configured for supporting the semiconductor wafer in spaced relationship with at least a portion of the porous surface of the susceptor.

3. A susceptor as set forth in claim 1 wherein the susceptor has an annular inner ledge for supporting the semiconductor wafer.

4. A susceptor as set forth in claim 1 further comprising lift pin holes in the porous surface to allow lift pins to pass through the susceptor.

5. A susceptor as set forth in claim 1 wherein the openings have a diameter of between about 0.1 millimeters and about 3 millimeters.

6. A susceptor as set forth in claim 1 wherein the openings have a diameter of between about 0.1 millimeters and about 1 millimeter.

7. A susceptor as set forth in claim 1 wherein the openings have a diameter of between about 0.5 millimeters and about 1 millimeter.

8. A susceptor as set forth in claim 1 wherein the openings are spaced between about 2 millimeters and about 2 centimeters apart.

9. A susceptor as set forth in claim 1 wherein the openings are spaced between about 6 millimeters and about 1.5 centimeters apart.

10. A susceptor as set forth in claim 1 wherein the porous surface has between about 0.8 openings/cm$^2$ and about 1.75 openings/cm$^2$.

11. A susceptor as set forth in claim 1 wherein the susceptor is configured such that the semiconductor wafer supported by the susceptor rests directly on the porous surface.

12. Apparatus for supporting a semiconductor wafer in a chamber of the type having an interior space, a gas inlet for directing gas to flow into the interior space of the chamber and a gas outlet through which the gas is exhausted from the interoir space of the chamber, the wafer having a front surface and a back surface, said apparatus comprising:
   a susceptor sized and configured for supporting the semiconductor wafer thereon within the interior space of the chamber, the susceptor having a porous surface having a density of openings of between about 0.5 openings/cm$^2$ and about 2 openings/cm$^2$, the porous surface being adapted to be in a generally parallel opposed relationship with the back surface of said semiconductor wafer and exposed to the interior of the chamber to permit gas flow inward through the porous surface for contact with the back surface of the semiconductor wafer and for further flow outward through the porous surface for exhaustion from the chamber via the gas outlet thereof while the semiconductor is supported by the susceptor.

13. Apparatus as set forth in claim 12 further comprising a support for supporting the susceptor within the interior space of the chamber such that the porous surface of the susceptor is substantially exposed to the gas flowing within the interior space of the chamber.

14. Apparatus as set forth in claim 13 wherein the support is rotatable within the interior space of the chamber to rotate the susceptor therein.

15. Apparatus as set forth in claim 12 further comprising a heating element.

16. Apparatus as set forth in claim 12 wherein the susceptor is configured for supporting the semiconductor wafer in spaced relationship with the porous surface.

17. Apparatus as set forth in claim 12 wherein the susceptor has an annular inner ledge for supporting the semiconductor wafer.

18. Apparatus as set forth in claim 12 further comprising an edge ring surrounding the periphery of the susceptor.

19. Apparatus as set forth in claim 12 wherein the openings have a diameter of between about 0.1 millimeters and about 3 millimeters.

20. Apparatus as set forth in claim 12 wherein the openings have a diameter of between 0.1 millimeters and about 1 millimeter.

21. Apparatus as set forth in claim 12 wherein the openings have a diameter of between about 0.5 millimeters and about 1 millimeter.

22. Apparatus as set forth in claim 12 wherein the openings are spaced between about 2 millimeters and about 2 centimeters apart.

23. Apparatus as set forth in claim 12 wherein the openings are spaced between about 6 millimeters and about 1.5 centimeters apart.

24. Apparatus as set forth in claim 12 wherein the porous surface has between about 0.8 openings/cm$^2$ and about 1.75 openings/cm$^2$.

25. Apparatus as set forth in claim 12 wherein the total percentage of open area on the porous surface is between about 0.5% and about 4%.

26. Apparatus as set forth in claim 12 wherein the total percentage of open area on the porous surface is between about 1% and about 3%.

27. A process for growing an epitaxial silicon layer on a semiconductor wafer, the semiconductor wafer having a front surface and a back surface, the process comprising:
   introducing a cleaning gas into an epitaxial deposition chamber containing the semiconductor wafer such that the cleaning gas flows parallel to the front and back surfaces and contacts the front surface of the semiconductor wafer and substantially the entire back surface of the semiconductor wafer to remove a native oxide layer from the front surface and the back surface of the semiconductor wafer; and introducing a silicon containing source gas into the epitaxial deposition chamber to grow an epitaxial silicon layer on the front surface of the semiconductor wafer while introducing a purge gas into the epitaxial deposition chamber to remove out-diffused dopant atoms from the back surface of the semiconductor wafer away from the front surface of the semiconductor wafer.

28. The process as set forth in claim 27 wherein the cleaning gas is hydrogen or a hydrogen/hydrochloric acid mixture.

29. The process as set forth in claim 27 wherein the purge gas is selected from the group consisting of nitrogen, argon, hydrogen, and any mixture thereof.

30. The process as set forth in claim 27 wherein the epitaxial layer is between about 0.1 micrometer and about 200 micrometers thick.

31. The process as set forth in claim 27 wherein the source gas is introduced above the front surface of the semiconductor wafer and the purge gas is introduced below the back surface of the semiconductor wafer.

32. The process as set forth in claim 27 wherein the wafer is substantially free of heat gradients during the process.

33. A susceptor for use in apparatus for performing a chemical vapor deposition process wherein an epitaxial silicon layer is grown on a semiconductor wafer having a front surface and a back surface, said apparatus being of the type having a chamber, a gas inlet for directing gas into the chamber, a gas outlet through which gas is exhausted from the chamber, and the susceptor disposed in the chamber for supporting the wafer therein, said susceptor comprising:

a porous portion having openings therein extending through the susceptor from a first side to a second side thereof, the susceptor being configured for supporting the semiconductor wafer such that the back surface of said wafer is in opposed relationship with the first side of the porous portion of the susceptor to permit gas in the chamber to flow through the susceptor from the second side of the porous portion of the susceptor to said first side to facilitate the substantially free flow of said gas inward through the openings for contact with the back surface of the semiconductor wafer;

at least some of said openings in the porous portion of the susceptor being located therein such that when the semiconductor wafer is supported by the susceptor the at least some of said openings are disposed radially inward of a peripheral edge of the wafer.

34. A susceptor as set forth in claim 33 wherein the openings in the porous portion of the susceptor are distributed substantially uniformly over the porous portion of the susceptor.

35. A susceptor as set forth in claim 34 wherein the porous portion of the susceptor has a generally circular surface area over which the openings are distributed.

36. Apparatus for use in an epitaxial deposition process wherein an epitaxial silicon layer is grown on a semiconductor wafer, the semiconductor wafer having a front surface and a back surface, said apparatus comprising:

a susceptor having a porous portion having openings therein extending through the susceptor from a first side to a second side thereof, the susceptor being configured for supporting the semiconductor wafer such that the back surface of said wafer is in opposed relationship with the first side of the porous portion of the susceptor to permit gas to flow through the susceptor from the second side of the porous portion of the susceptor to said first side to facilitate the substantially free flow of said gas inward through the openings for contact with the back surface of the semiconductor wafer;

at least some of said openings in the porous portion of the susceptor being located therein such that when the semiconductor wafer is supported by the susceptor the at least some of said openings are disposed radially inward of a peripheral edge of the wafer; and a source of gas capable of directing said gas to flow over substantially the entire second side of the porous portion of the susceptor in fluid communication with the openings to permit said gas to flow inward through the openings for contacting the back surface of the wafer.

37. Apparatus as set forth in claim 36 wherein the source of gas is capable of directing said gas to flow over the second side of the porous portion of the susceptor in a direction generally parallel to said porous portion of the susceptor.

38. A susceptor for supporting a semiconductor wafer during a chemical vapor deposition process wherein an epitaxial silicon layer is grown on the semiconductor wafer, the semiconductor wafer having a front surface and a back surface, the susceptor comprising:

a porous surface in generally parallel, opposed relationship with the back surface of the semiconductor wafer supported by the susceptor to permit gas flow through the susceptor for contact with the back surface of said semiconductor wafer, the porous surface having a density of openings between about 0.2 openings/cm$^2$ and about 4 openings/cm$^2$, the total percentage of open area on the porous surface being between about 0.5% and about 4%.

39. A susceptor as set forth in claim 38 wherein the total percentage of open area on the porous surface is between about 1% and about 3%.

40. Apparatus for use in an epitaxial deposition process wherein an epitaxial silicon layer is grown on a semiconductor wafer, the semiconductor wafer having a front surface and a back surface, said apparatus comprising:

a deposition chamber defining an interior space and having a gas inlet through which a gas is directed to flow into the interior space of the chamber and a gas outlet through which the gas is exhausted from the interior space of the chamber;

a susceptor disposed in the interior space of the chamber and having a porous portion having openings therein extending through the susceptor from a first side to a second side thereof, the susceptor being configured for supporting the semiconductor wafer such that the back surface of said wafer is in opposed relationship with the first side of the porous portion of the susceptor; and a susceptor support for supporting the susceptor in the chamber such that the second side of the susceptor is exposed to the interior of the chamber to permit to facilitate the substantially free flow of said gas inward through the porous surface of the susceptor for contact with the back surface of the semiconductor wafer and for further flow outward through said porous surface of the susceptor for exhaustion from the chamber via the gas outlet thereof.

41. A process for treating the back surface of a semiconductor wafer with a gas, the semiconductor wafer having a front surface and a back surface, the process comprising:

loading the wafer into a susceptor disposed in the interior space of a chamber, the susceptor having a porous portion having openings therein extending through the susceptor from a first side to a second side thereof, said loading step comprising loading the wafer into the susceptor such that the back surface of the wafer is in opposed relationship with the first side of the porous portion of susceptor;

supporting the susceptor in the interior space of the chamber such that the second side of the susceptor is exposed to the interior space of the chamber;

directing gas to flow into the interior space of the chamber to facilitate the substantially free flow of said gas inward through the porous surface of the susceptor for contact with the back surface of the semiconductor wafer to treat said back surface to facilitate to the further flow of said gas outward through said porous surface of the susceptor back into the interior space of the chamber; and exhausting said gas from the interior space of the chamber.

42. A process as set forth in claim 41, further comprising the step of rotating the susceptor within the interior space of the chamber as glow is directed to flow into the interior space of the chamber.

* * * * *

UNITED STATES PATENT AND TRADEMARK OFFICE
CERTIFICATE OF CORRECTION

PATENT NO.   : 6,444,027 B1
DATED        : September 3, 2002
INVENTOR(S)  : Charles Chiun-Chieh Yang and Robert W. Standley It is certified that error appears in the above-identified patent and that said Letters Patent is hereby corrected as shown below:

Column 10,
Line 41, "between 0.1 millimeters" should read -- between about 0.1 millimeters --.

Column 12,
Lines 56-57, "to permit to facilitate" should read -- to facilitate --.

Column 13,
Line 6, "portion of susceptor;" should read -- portion of the susceptor; --.

Column 14,
Line 1, "surface to facilitate to" should read -- surface and to facilitate --.
Line 10, "as glow is directed" should read -- as gas is directed --.

Signed and Sealed this

Twenty-fifth Day of February, 2003

JAMES E. ROGAN
*Director of the United States Patent and Trademark Office*